(12) United States Patent
Ghassemi et al.

(10) Patent No.: US 7,518,933 B2
(45) Date of Patent: Apr. 14, 2009

(54) CIRCUIT FOR USE IN A MULTIPLE BLOCK MEMORY

(75) Inventors: Hamed Ghassemi, Austin, TX (US);
Huy B. Nguyen, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 252 days.

(21) Appl. No.: 11/672,279

(22) Filed: Feb. 7, 2007

(65) Prior Publication Data
US 2008/0186797 A1    Aug. 7, 2008

(51) Int. Cl.
*G11C 7/10* (2006.01)
(52) U.S. Cl. .......................... 365/189.02; 365/230.03; 365/230.08; 365/154
(58) Field of Classification Search ............ 365/189.02, 365/230.03, 230.08, 154
See application file for complete search history.

(56) References Cited
U.S. PATENT DOCUMENTS

| | | | |
|---|---|---|---|
| 4,887,242 A | * | 12/1989 | Hashimoto ............. 365/185.29 |
| 5,901,086 A | | 5/1999 | Wang et al. |
| 6,842,059 B1 | | 1/2005 | Wu |
| 6,961,276 B2 | | 11/2005 | Atallah et al. |
| 2005/0057976 A1 | | 3/2005 | Joo et al. |

* cited by examiner

*Primary Examiner*—Son Dinh
*Assistant Examiner*—Nam Nguyen
(74) *Attorney, Agent, or Firm*—Ranjeev Singh; Susan C. Hill

(57) ABSTRACT

A portion of a memory may include a first memory block, including a first memory cell coupled to a first memory data line, a second memory block, including a second memory cell coupled to a second memory data line, and a latch, having a first terminal and a second terminal. The portion of the memory may further include a first N-channel transistor, having a first current electrode coupled to the first terminal of the latch, having a second current electrode coupled to a first power supply voltage, and having a control electrode coupled to the first memory data line. The portion of the memory may further include a second N-channel transistor, having a first current electrode coupled to the first terminal of the latch, having a second current electrode coupled to the first power supply voltage, and having a control electrode coupled to the second memory data line.

20 Claims, 2 Drawing Sheets

CIRCUIT FOR USE IN A MULTIPLE BLOCK MEMORY

BACKGROUND

1. Field

This disclosure relates generally to memories, and more specifically, to a circuit for use in a multiple block memory.

2. Related Art

Increasingly, memories have multiple blocks each of which generates output data. The data outputs generated by the memory blocks are multiplexed using a multiplexer that multiplexes the data outputs to provide an output corresponding to the selected memory block. The multiplexer, however, adds delay during a read operation.

Moreover, where outputs of several memory blocks need multiplexing, the multiplexer circuit becomes more cumbersome. Accordingly, there is a need for a circuit for use in a multiple block memory that is simpler and reduces delay during the read operation.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
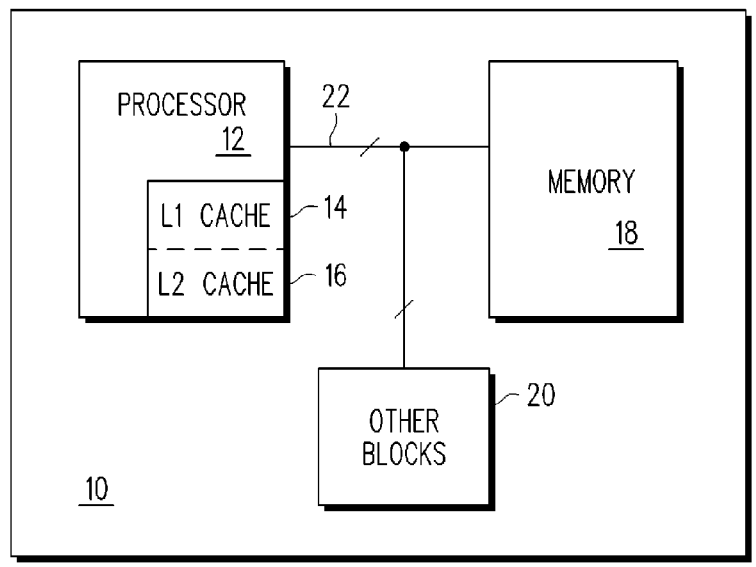
FIG. 1 is a block diagram of an integrated circuit having cache and memory.

In a multiple block memory, only one block is selected for outputting data. Exemplary embodiments of the invention use the unselected state of the memory blocks to accomplish the multiplexing of output signals. The true and complementary data outputs from a selected block are combined with the state of the un-selected blocks to multiplex the data output. By way of example, the data output from each memory block feeds into the gate of an N-channel device. The drains of the N-channel devices are common to other N-channel devices. The sources of the N-channel devices are tied to ground.

In one aspect, a circuit portion may include a latch, having a first terminal and having a second terminal. The circuit portion may further include a first N-channel transistor, having a first current electrode, a second current electrode coupled to a power supply voltage, and a control electrode coupled to a first conductor of a first differential pair. The circuit portion may further include a second N-channel transistor, having a first current electrode coupled to the first current electrode of the first N-channel transistor and coupled to the first terminal of the latch, a second current electrode coupled to a power supply voltage, and a control electrode coupled to a first conductor of a second differential pair. The circuit portion may further include a third N-channel transistor, having a first current electrode, a second current electrode coupled to a power supply voltage, and a control electrode coupled to a second conductor of the first differential pair. The circuit portion may further include a fourth N-channel transistor, having a first current electrode coupled to the first current electrode of the third N-channel transistor and coupled to the second terminal of the latch, the fourth N-channel transistor having a second current electrode coupled to a power supply voltage, and a control electrode coupled to a second conductor of the second differential pair.

In another aspect, a portion of a memory may include a first memory block comprising a first memory cell coupled to a first memory data line. The portion of the memory may further include a second memory block comprising a second memory cell coupled to a second memory data line. The portion of the memory may further include a latch, having a first terminal and a second terminal. The portion of the memory may further include a first N-channel transistor, having a first current electrode coupled to the first terminal of the latch, having a second current electrode coupled to a first power supply voltage, and having a control electrode coupled to the first memory data line. The portion of the memory may further include a second N-channel transistor, having a first current electrode coupled to the first terminal of the latch, having a second current electrode coupled to the first power supply voltage, and having a control electrode coupled to the second memory data line.

In yet another aspect, a method for multiplexing in a memory is provided. The method includes providing a first memory block and providing a second memory block. The method further includes providing a first pair of differential data outputs from the first memory block. The method further includes providing a second pair of differential data outputs from the second memory block. The method further includes multiplexing the first pair of differential data outputs and the second pair of differential data outputs using a plurality of common-drain connected N-channel transistors to provide an output.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

FIG. 1 is a block diagram of an integrated circuit 10 having cache and memory. Integrated circuit 10 may include a processor 12, a memory 18, and other blocks 20. Processor 12 may be coupled to memory 18 and other blocks 20 via a bus 22. Processor 12 may include L1 cache 14 and L2 cache 16. Although FIG. 1 shows specific components of integrated circuit 10, integrated circuit 10 may include more or fewer components.

Figure 2:
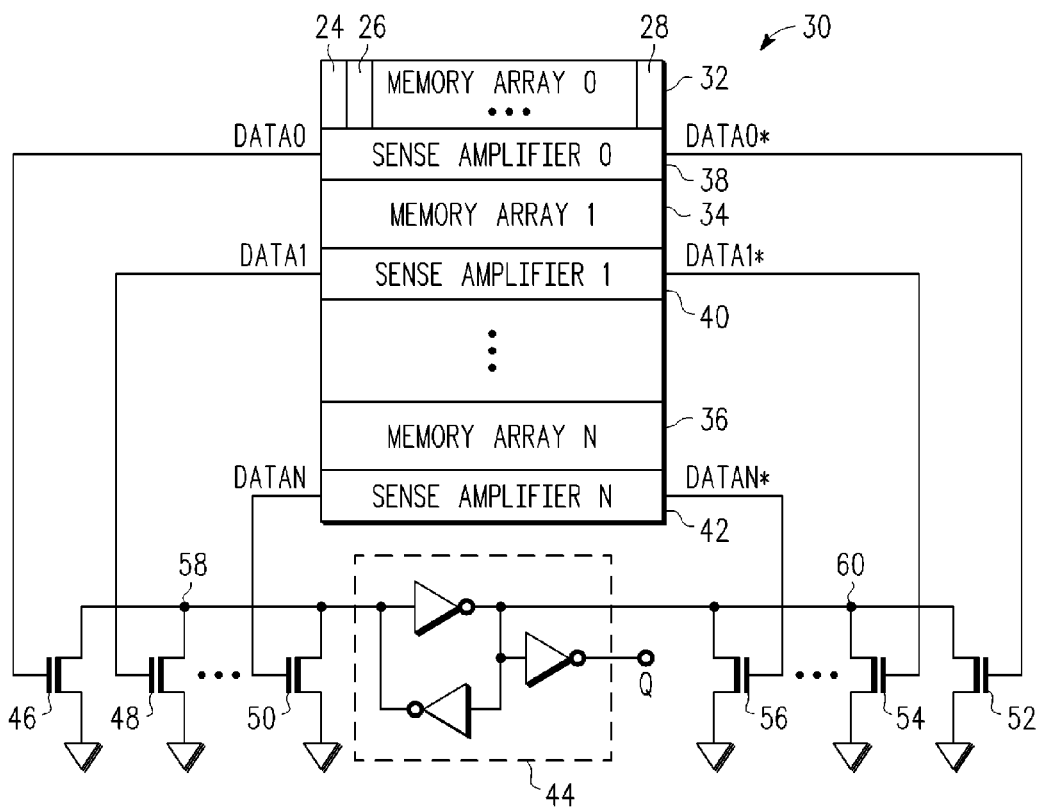
FIG. 2 is a block diagram of an exemplary portion of a cache or a memory.

FIG. 2 is a block diagram of an exemplary portion 30 of a cache or a memory. Exemplary portion 30 may be a portion of memory 18, L1 cache 14, L2 cache 16, or any other memory type structure. Exemplary portion 30 may include several memory blocks. Each memory block may include a memory array and a sense amplifier block. For example, FIG. 2 shows N memory blocks having N memory arrays: MEMORY ARRAY 0 32, MEMORY ARRAY 1 34, AND MEMORY ARRAY N 36. Each memory array may include memory cells coupled to a true data line and a complementary data line. For example, MEMORY ARRAY0 32 may include columns of memory cells 24, 26, and 28. FIG. 2 further shows N sense amplifier blocks: SENSE AMPLIFIER 0 38, SENSE AMPLIFIER 1 40, and SENSE AMPLIFIER N 42. Each memory column in each memory block outputs true and complementary data on data lines, DATA0 and DATA0*, for example. The combination of the true and complementary data lines DATA0 and DATA0* forms a differential pair. At a time only one block out of the N memory blocks may output data. In particular, only one of the blocks may be selected based on block select signal and the selected block may output data in response to a clock signal. Exemplary portion 30 of memory may further include a latch and driver 44, which may provide output Q corresponding to the selected memory block. The latch may be implemented using a pair of cross-coupled inverters, as shown. The true data output of a memory column of MEMORY ARRAY 0 is coupled to the gate of an N-channel device 46 via a data line labeled DATA0. The true data output of a memory column of MEMORY ARRAY 1 is coupled to the gate of an N-channel device 48 via a data line labeled DATA1. The true data output of a memory column of MEMORY ARRAY N is coupled to the gate of an N-channel device 50 via a data line labeled DATAN. The drains of N-channel devices 46, 48, and 50 are tied together to form node 58. The sources of N-channel devices 46, 48, and 50 are tied to ground. Node 58 is coupled to one side of latch and driver 44. The complementary data output of a memory column of MEMORY ARRAY 0 is coupled to the gate of an N-channel device 52 via a data line labeled DATA0*. The complementary data output of a memory column of MEMORY ARRAY 1 is coupled to the gate of an N-channel device 54 via a data line labeled DATA1*. The complementary data output of a memory column of MEMORY ARRAY N is coupled to the gate of an N-channel device 56 via a data line labeled DATAN*. The drains of N-channel devices 52, 54, and 56 are tied together to form node 60. The sources of N-channel devices 52, 54, and 56 are tied to ground. Node 60 is coupled to the other side of latch and driver 44, as shown in FIG. 2.

In operation, as noted above only one of the memory blocks is selected at a time. Accordingly, only one of data lines DATA0, DATA1, DATA N, DATA0*, DATA1*, and DATAN* can have valid data (high, for example). The data outputs for the unselected memory blocks are coupled to the N-channel devices 46, 48, 50, 52, 54, and 56 in a manner that the input at the gate of each of these N-channel devices is low. For example, the data outputs may be coupled via a NOR gate (not shown) to the gates of the N-channel devices. By way of example, during a read operation, in response to an input address if a bit corresponding to MEMORY ARRAY 0 is selected for the read operation, then the sense amplifier corresponding to MEMORY ARRAY 0 is enabled. This results in the sense amplifiers generating a true and complement output on data lines DATA0 and DATA0*, respectively one of which is high. If the true output on data line DATA0 is high then N-channel device 46 is turned on, which in turns pulls node 58 to ground. This in turn results in the output Q to be changed to a low value. Alternatively, if the complementary output on data line DATA0* is high then N-channel device 52 is turned on, which in turn pulls node 60 to ground. This in turn results in the output Q to a high value.

Figure 3:
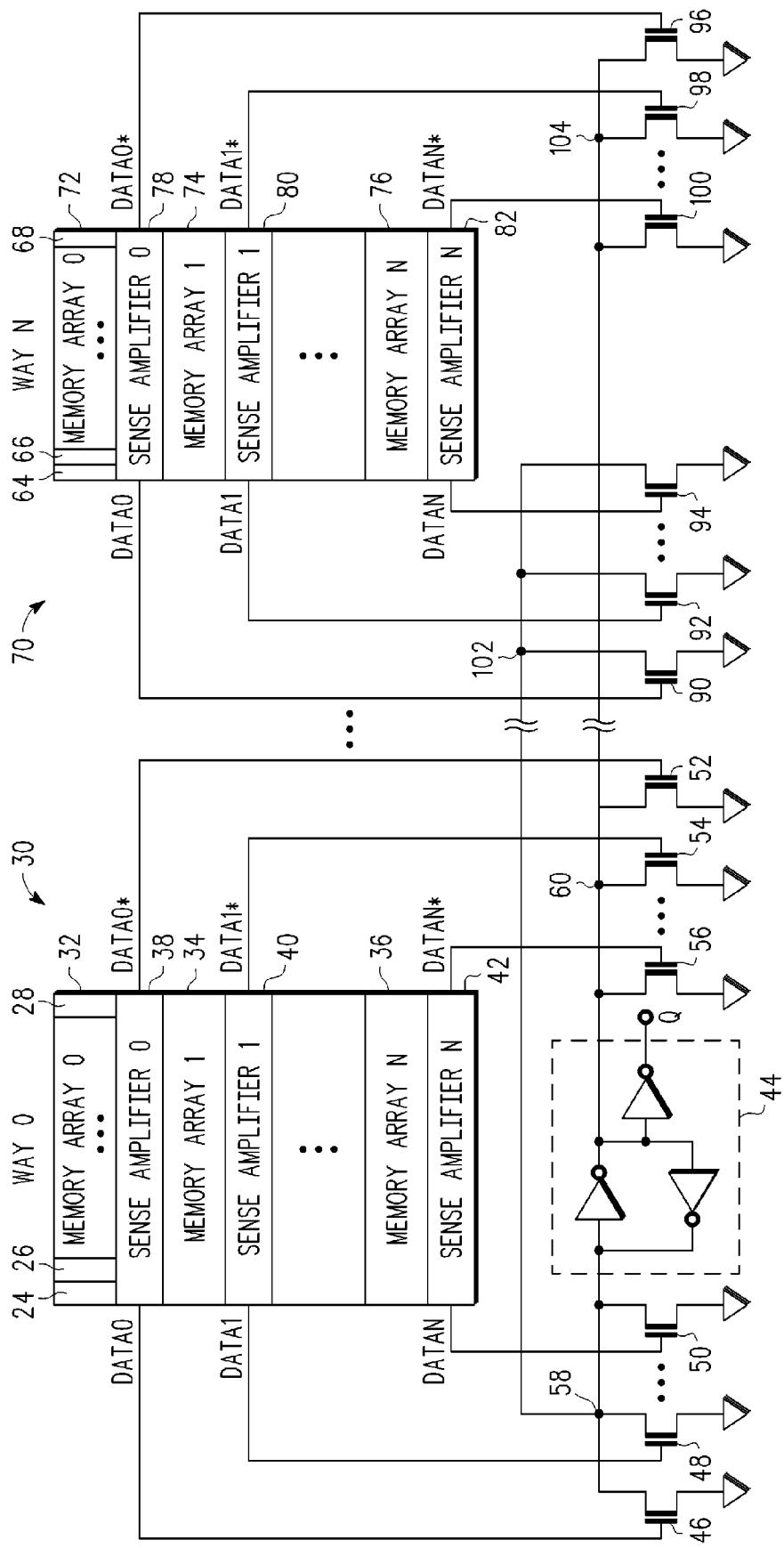
FIG. 3 is a block diagram of another exemplary portion of a cache or a memory.

FIG. 3 is a block diagram of another exemplary portion of a cache or a memory. FIG. 3 shows portions 30 and 70 of a multi-way memory, which can be used for interleaving. FIG. 3 shows a N-way memory including portions: WAY0 and WAY N. WAY0 portion may be implemented using exemplary portion 30 of FIG. 1. WAYN portion may have similar structure as portion 30 of FIG. 1, except it will not have its own latch and driver. Instead, portion 70 corresponding to WAYN shares latch and driver 44. Portion 70 may include MEMORY ARRAY 0 72, MEMORY ARRAY 1 74, AND MEMORY ARRAY N 76. Each memory array may include memory cells coupled to a true data line and a complementary data line. For example, MEMORY ARRAY0 32 may include memory cells 24, 26, and 28. Additionally, MEMORY ARRAY0 72 may include memory cells 64, 66, and 68. FIG. 3 further shows N sense amplifier blocks: SENSE AMPLIFIER 0 78, SENSE AMPLIFIER 1 80, and SENSE AMPLIFIER N 82. Like portion 30, each memory block outputs true and complementary data on data lines DATA0 and DATA0*, for example. At a time only one block out of the N memory blocks may output data. In particular, only one of the blocks may be selected based on block select signal and the selected block may output data in response to a clock signal. The true data output of a memory column of MEMORY ARRAY 0 is coupled to the gate of an N-channel device 90 via a data line labeled DATA0. The true data output of a memory column of MEMORY ARRAY 1 is coupled to the gate of an N-channel device 92 via a data line labeled DATA1. The true data output of a memory column of MEMORY ARRAY N is coupled to the gate of an N-channel device 94 via a data line labeled DATAN. The drains of N-channel devices 90, 92, and 94 are tied together to form node 102. The sources of N-channel devices 90, 92, and 94 are tied to ground. Node 104 is coupled to one side of latch and driver 44. The complementary data output of a memory column of MEMORY ARRAY 0 is coupled to the gate of an N-channel device 96 via data line labeled DATA0*. The complementary data output of a memory column of MEMORY ARRAY 1 is coupled to the gate of an N-channel device 98 via a data line labeled DATA1*. The complementary data output of a memory column of MEMORY ARRAY N is coupled to the gate of an N-channel device 100 via a data line labeled DATAN*. The drains of N-channel devices 96, 98, and 100 are tied together to form node 104. The sources of N-channel devices 96, 98, and 100 are tied to ground. Node 104 is coupled to the other side of latch and driver 44, as shown in FIG. 3.

In operation, at a time only one memory block out of the memory blocks corresponding to WAY0 portion and WAYN portion is active. Similar to the operation of portion 30 described above with respect to FIG. 2, portions 30 and 70 operate to produce output Q.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of integrated circuit 10 are located on a single integrated circuit. Alternatively, components of integrated circuit 10 may be located on any number of separate integrated circuits or separate devices interconnected with each other. As such, integrated circuit 10 may be embodied in a hardware description language of any appropriate type.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, although the above embodiments are described with reference to a memory having true and complementary outputs, they may be used with a memory having only true or complementary output, as well. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A circuit portion, comprising:
   a latch, having a first terminal and having a second terminal;
   a first N-channel transistor, having a first current electrode, a second current electrode coupled to a power supply voltage, and a control electrode coupled to a first conductor of a first differential pair;
   a second N-channel transistor, having a first current electrode coupled to the first current electrode of the first N-channel transistor and coupled to the first terminal of the latch, a second current electrode coupled to the power supply voltage, and a control electrode coupled to a first conductor of a second differential pair;
   a third N-channel transistor, having a first current electrode, a second current electrode coupled to the power supply voltage, and a control electrode coupled to a second conductor of the first differential pair; and
   a fourth N-channel transistor, having a first current electrode coupled to the first current electrode of the third N-channel transistor and coupled to the second terminal of the latch, a second current electrode coupled to the power supply voltage, and a control electrode coupled to a second conductor of the second differential pair.

2. A circuit portion as in claim 1, wherein only one of the first transistor, the second transistor, the third transistor, and the fourth transistor is conducting at any time.

3. A circuit portion as in claim 1, wherein the latch comprises cross-coupled inverters.

4. A circuit portion as in claim 1, further comprising:
   a first sense amplifier for providing the first differential pair; and
   a second sense amplifier for providing the second differential pair.

5. A circuit portion as in claim 1, wherein the circuit portion is formed as part of a static random access memory or a cache.

6. A circuit portion as in claim 5, wherein the cache comprises a level two cache.

7. A circuit portion as in claim 5, wherein the first differential pair is associated with a first cache way and the second differential pair is associated with a second cache way.

8. A circuit portion as in claim 7, wherein the first cache way and the second cache way are not selected at a same time.

9. A circuit portion as in claim 1, wherein the power supply voltage is approximately ground.

10. A memory, comprising:
    a first memory block, comprising a first memory cell coupled to a first memory data line;
    a second memory block, comprising a second memory cell coupled to a second memory data line;
    a latch, having a first terminal and a second terminal;

a first N-channel transistor, having a first current electrode coupled to the first terminal of the latch, having a second current electrode coupled to a power supply voltage, and having a control electrode coupled to the first memory data line; and a second N-channel transistor, having a first current electrode coupled to the first terminal of the latch, having a second current electrode coupled to the power supply voltage, and having a control electrode coupled to the second memory data line.

11. A memory as in claim 10, wherein the first memory block further comprises a third memory data line and wherein the second memory block further comprises a fourth memory data line, and wherein the first memory data line and the third memory data line comprise a first differential pair, and wherein the second memory data line and the fourth memory data line comprise a second differential pair, the memory further comprising:

a third N-channel transistor, having a first current electrode coupled to the second terminal of the latch, having a second current electrode coupled to the power supply voltage, and having a control electrode coupled to the third memory data line; and a fourth N-channel transistor, having a first current electrode coupled to the second terminal of the latch, having a second current electrode coupled to the power supply voltage, and having a control electrode coupled to the fourth memory data line.

12. A memory as in claim 11, wherein only one of the first transistor, the second transistor, the third transistor, and the fourth transistor is conducting at any time.

13. A memory as in claim 10, wherein the latch comprises cross-coupled inverters.

14. A memory as in claim 11, further comprising:
a first sense amplifier for providing the first differential pair; and
a second sense amplifier for providing the second differential pair.

15. A memory as in claim 10, wherein the memory comprises a static random access memory.

16. A memory as in claim 11, wherein the memory is formed as part of a cache.

17. A memory as in claim 16, wherein the cache comprises a level two cache.

18. A circuit portion as in claim 16, wherein the first differential pair is associated with a first cache way and the second differential pair is associated with a second cache way.

19. A method for multiplexing in a memory, the method comprising:
providing a first memory block;
providing a second memory block;
providing a first pair of differential data outputs from the first memory block;
providing a second pair of differential data outputs from the second memory block; and
multiplexing the first pair of differential data outputs and the second pair of differential data outputs using a plurality of common-drain connected N-channel transistors to provide an output.

20. A method as in claim 19, wherein no more than one of the plurality of common-drain connected N-channel transistors is conducting at any time.

* * * * *